United States Patent [19]

Ueyama

[11] Patent Number: 4,767,992

[45] Date of Patent: Aug. 30, 1988

[54] MAGNETIC RESONANCE IMAGING SYSTEM

[75] Inventor: Akihide Ueyama, Tochigi, Japan

[73] Assignee: Kabushiki Kaisha Toshiba, Kawasaki, Japan

[21] Appl. No.: 101,400

[22] Filed: Sep. 28, 1987

[30] Foreign Application Priority Data

Sep. 29, 1986 [JP] Japan .............................. 61-228235

[51] Int. Cl.⁴ ............................................ G01R 33/20
[52] U.S. Cl. ...................................... 324/313; 324/309
[58] Field of Search ............... 324/300, 307, 309, 312, 324/313, 314

[56] References Cited

U.S. PATENT DOCUMENTS

| 4,318,043 | 3/1982 | Crooks | 324/309 |
| 4,599,565 | 7/1986 | Hoenninger | 324/309 |
| 4,685,468 | 8/1987 | Macouski | 324/309 |
| 4,707,658 | 11/1987 | Frahm | 324/309 |
| 4,710,717 | 12/1987 | Pelc | 324/309 |

Primary Examiner—Michael J. Tokar
Attorney, Agent, or Firm—Foley & Lardner, Schwartz, Jeffery, Schwaab, Mack, Blumenthal & Evans

[57] ABSTRACT

A magnetic resonance imaging system is made up of a static field generator, a gradient field generator, an excitation pulse generator, a receiver, a controller for controlling the static field generator, gradient field generator, excitation pulse generator, and receiver, and an image processor. The controller includes a multi-slice control section and an adjustment/control section. The multi-slice controller sequentially controls use excitation of a plurality of slices by a plurality of excitation pulses of different carrier frequencies in a common static field and a gradient field. Through these excitations, the magnetic resonance data for the plurality of slices is obtained with one excitation repetition period, and the multi-slice imaging can be performed by a predetermined number of repetitive excitations. The adjustment/control section operates the multi-slice control section for the adjustment of the respective adjustment-required parameters of the MRI system, and causes it to execute the adjustments of adjustment-required parameters of the MRI system, which are different with those slices subjected to the imaging, in connection with the multi-slice imaging.

8 Claims, 3 Drawing Sheets

MAGNETIC RESONANCE IMAGING SYSTEM

BACKGROUND OF THE INVENTION

This invention relates to a magnetic resonance imaging (MRI) system in which an excitation pulse, a high frequency magnetic field or an RF (radio frequency) field, is applied to an object being examined, located in a static field and applied with a suitable gradient flied, to excite a magnetic resonance (MR) phenomenon, and MR signals generated by a specific atomic nucleus spin in the object is received, and appropriately processed, to obtain the image information at a selected portion of the object. More particularly, this invention relates to a system which can reduce the time taken for the MRI system adjustment.

In the MRI system, a uniform static magnetic field is applied to a desired portion of the object. The same portion is applied with a suitable gradient field and an excitation pulse, an RF magnetic field, orthogonal to the static magnetic field. Under this condition, the MR phenomenon occurs in the selected slice portion of the object. An MR signal is generated by a specific atomic nucleus spin in the object through the MR phenomenon exactly after the RF magnetic field is removed. The MR signal is received and appropriately processed. Finally, the image information of the selected portion of the object is obtained. Two independent RF coils or a single RF coil for both transmission and reception is used for transmitting the excitation pulse and receiving the MR signal. The gradient fields usually used are a gradient field to determine the slice position with respect to the static field direction and a gradient field for the phase encoding and the reading of the MR signal used when the two-dimensional Fourier conversion method is employed.

In the MRI system, before two steps of operations, the MR exciting and the collection of the MR signal, are performed for obtaining the MR image, the same operations are performed in a condition that the object is placed in a predetermined image pick-up area. These operations are needed for adjusting the various parameters of the MRI system.

The automatic adjustment of these parameters is called a "prescan". The parameters subjected to the prescan contain mainly a static field intensity, a tuning for receiving an MR signal, a transmitting power, and a receiving gain in the receiving system.

The adjustment of the static field intensity is normally performed when the normal conductivity coil is used for generating a static magnetic field. This adjustment optimizes the magnetic field intensity. An improper static magnetic field causes a beat in the MR signal, and reduces the level of the received MR signal. The impropery of the static magnetic field arises mainly from a variation in the power voltage for driving the static field coil, which is for generating the static magnetic field. The static magnetic field adjustment is such that the MR signal received is Fourier analyzed to detect the beat, and some adjustment is made to remove the beat.

Due to the tuning for receiving an MR signal a receiving system in the MRI system is tuned to the MR signal. The detuning of the receiving system occurs due to the fact that the resonating conditions of the receiving system depends on the size of the object under examination. The untuned receiving system provides a reduced level of the received MR signal. The tuning is the adjustment of a tuning parameter of the tuning circuit, for example, a capacitance of a tuning capacitor, in the receiving system, such that the received MR signal level is maximized.

The transmitting power adjustment is for optimizing the power of the exciting pulse, e.g., a $\pi/2$ (90°) pulse and/or a $\pi$ pulse (180°) respectively for flipping the magnetization by 90° and by 180°. The power of the excitation pulse necessary for flipping the magnetization by a predetermined angle is large for large objects, and small for small objects. The exciting pulse adjustment optimizes an accuracy of the flip angle of the magnetization by the exciting pulse. An inappropriate flip angle provides a level of the received MR signal. To avoid this, the exciting pulse power is adjusted so as to maximize the magnitude of the received MR signal.

The receiving gain adjustment is for adjusting a gain of the receiving system. The received signals are not uniform in level. The gain in the receiving system is adjusted so that the received signal levels fall within the dynamic range of the input stage of a signal processing system. This adjustment is made for ensuring the satisfactory operation of the signal processing system.

These adjustments must be made every time the object is exchanged by a new one.

FIG. 1 shows a sequence of the automatic adjustment process on the basis of the prescan including the adjustments of the static field, tuning system, transmitting power, and receiving gain, when it is executed by a conventional MRI system. In the figure, A1 to Ana, B1 to Bnb, C1 to Cnc, and D1 to Dnd represent the excitations for those adjustments of the static field, tuning system, transmitting power, and receiving gain. The number of those excitations na, nb, nc and nd have different figures. For ease of explanation, the average value of these figures is used and denoted as n. Each excitation is performed at repetition periods TR. As seen from FIG. 1, the above four adjustment-required parameters are adjusted in a time-sequential manner. A total time TT required for those four parameters is expressed by the following equation $$TT = (na \times TR) + (nb \times TR) + (nc \times TR) + (nd \times TR)$$
$$= (n \times TR) \times 4$$
$$= 4nTR$$

If n=16 and TR=1 sec., TT is 64 sec.

As already known, the image pick-up time in the MRI system is longer than that of other tomography systems, e.g., an X-ray CT (computed tomography). A long prescan time hinders the quick operation of the image pick-up, and places a patient, if the object is the patient, under uneasiness. For these reasons, it is desirous to reduce the prescan time as short as possible.

The reduction of the prescan time is the technical problem now being encountered and urgently solved in this field.

SUMMARY OF THE INVENTION

Accordingly, an object of this invention is to provide an MRI system with a reduced time taken for the automatic adjustment by the prescan.

In an MRI system according to this invention, a plurality of slices are sequentially excited by a plurality of exciting pulses of different carrier frequencies in a common static field and a gradient field. A multi-slice imaging is performed within one repetition period, to obtain the magnetic resonance data of the slices. The different adjustment-required parameters of the MRI system are adjusted for each slice to be imaged. The adjustments of those parameters can be performed in a parallel fashion.

Thus, the different adjustment-required parameters are adjusted for each slice, which is subjected to the process including the multi-slicing imaging, the excitation of the MR, and the collection of the MR signals. This provides the parallel execution of the automatic adjustments of the plurality of adjustment-required parameters. The result is the reduction of the total prescan time of all of the parameters.

DETAILED DESCRIPTION OF THE PREFERRED EMBODIMENTS

Figure 1:
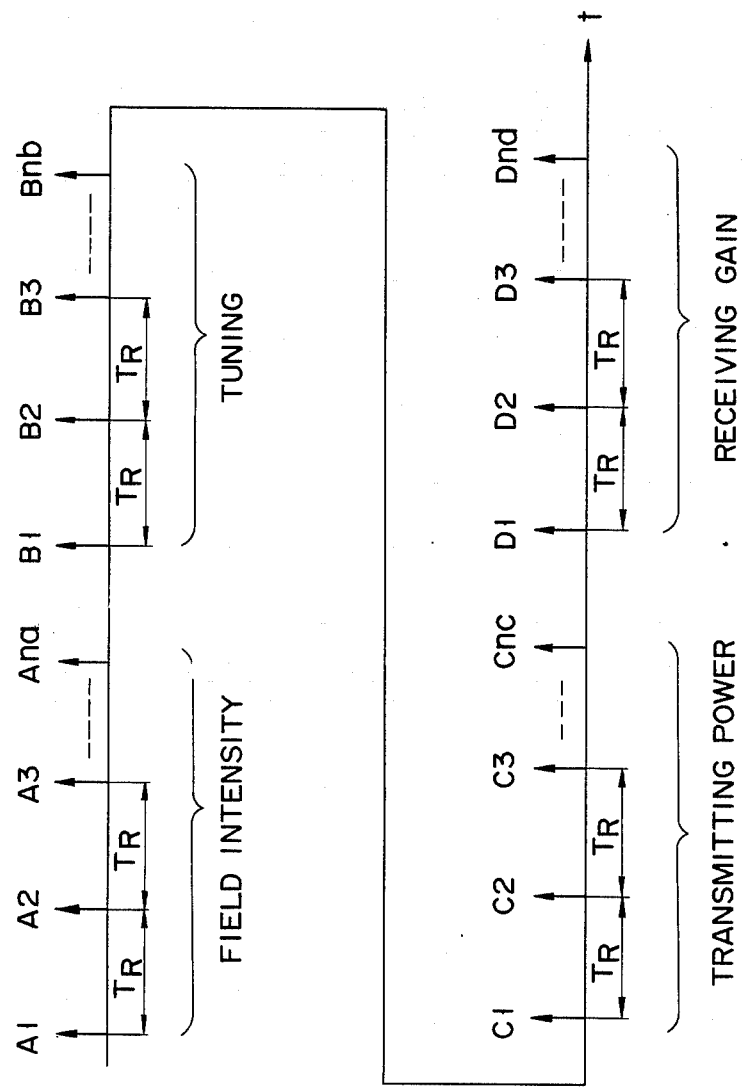
FIG. 1 shows a model of a sequence of prescan adjustment in a conventional MRI system.
Figure 2:
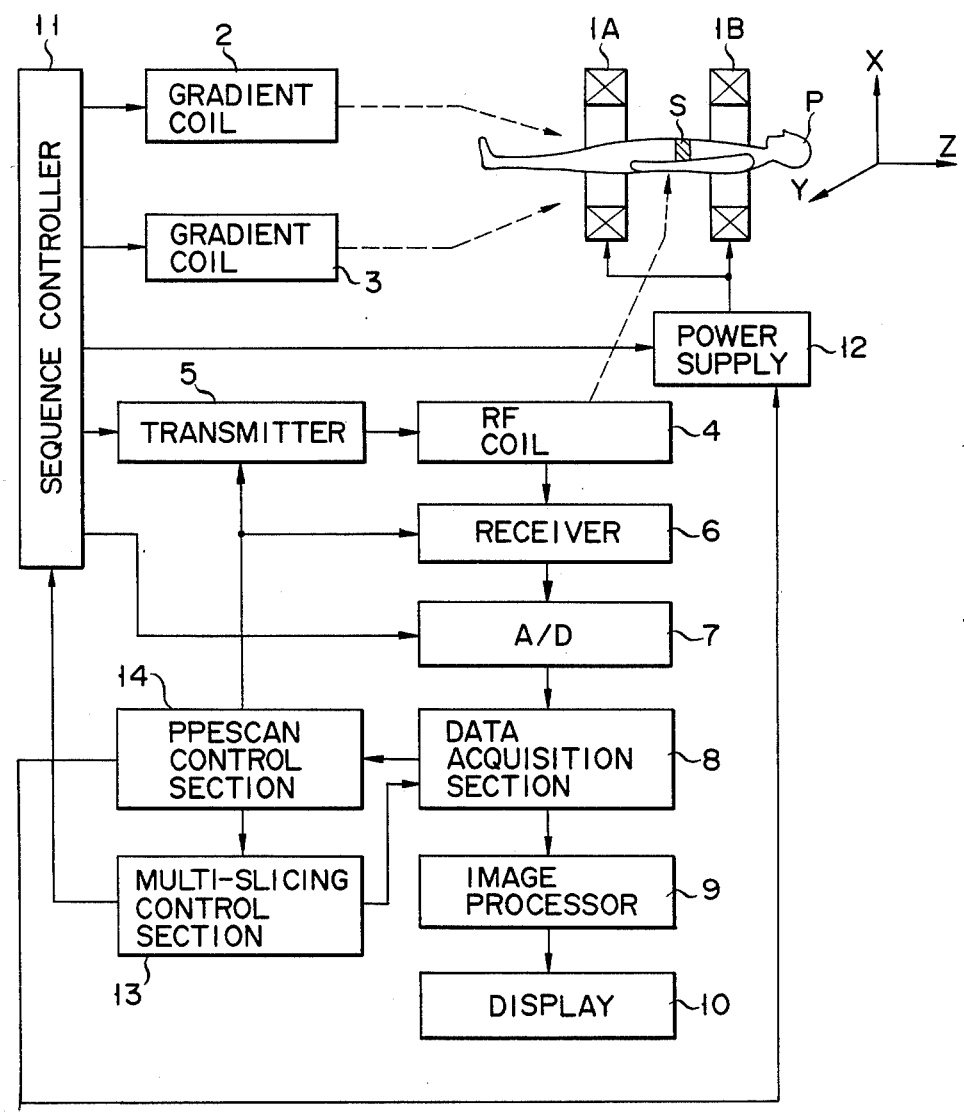
FIG. 2 shows a block diagram showing an arrangement of an MRI system according to an embodiment of this invention.

Reference is made to FIG. 2 illustrating an MRI system according to an embodiment of this invention.

As shown, the MRI system is made up of static field coil 1A, gradient field coils 2 and 3, RF coil 4, transmitter 5, receiver 6, A/D (analog to digital) converter 7, data acquisition section 8, image processor 9, display 10, sequence controller 11, power source 12, multi-slicing control section 13, and scan control section 14.

A pair of static field coils 1A and 1B are excited by power source 12 to generate a uniform static magnetic field to be applied to an object P to be examined. First gradient field coil 2 generates a gradient magnetic field of the Z-axial direction, which is applied to object P and determines the location of picked up slice S of object P. Second gradient field coil 3 generates a gradient field which has a direction placed on the X-y plane, is applied to object P, and is used for MR signal encoding and reading. RF coil 4, when excited by transmitter 5, applies $\pi/2$ and $\pi$ pulses to object P at predetermined timings, detects MR echoes (spin echoes) from object P, and relays it to receiver 6. Receiver 6 detects the MR echoes by a phase detector, such as a quadrature detector. A/D converter 7 digitizes the MR echoes, which are detected and extracted by receiver 6, and applies it to data acquisition section 8. This section 8 collects and stores the MR data. Image processor 9 appropriately processes the MR data and forms an MR image. Display 10 visually provides an image formed on the basis of the MR image data. Sequence controller 11 appropriately controls gradient field coils 2 and 3, transmitter 5, A/D converter 7 and power source 12 so that the MR excitation and the MR data collection are performed in a predetermined sequence.

Multi-slice control section 13 controls data acquisition section 8 and sequence controller 11 when the MRI system is in the prescan mode and in the multi-slice imaging mode. Under control by this section, the multi-slice MR excitation and the MR data collection are performed smoothly.

Prescan control section 14 drives multi-slice control section 13 to adjust, before the intended imaging, the adjustment-required parameters, such as the static field intensity, tuning system, transmitting power and receive gain adjustment in a condition that the object is placed in the image pick-up area. Further, it controls transmitter 5, receiver 6 and power source 12 for static magnetic field generation, on the basis of the data as collected by data acquisition section 8 when the system is in the multi-slice imaging mode.

Figure 3:
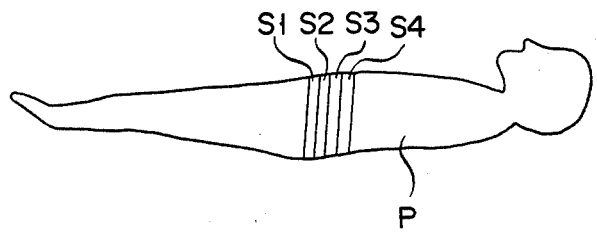
FIG. 3 shows a diagram useful in explaining the multi-slice imaging, which is used for the prescan in the FIG. 2 system.

The multi-slicing will be described. The gradient field developed by gradient field coil 2 and an RF excitation pulse (usually a selective excitation pulse) at a predetermined carrier frequency $\omega 0$ are applied, in the body axial direction, for example, to object P (human body, in this instance) placed in a static magnetic field, which is developed by static field coils 1A and 1B. Under this condition, the MR is excited in the slice of the human body which is located at a predetermined position on the body axis. After a predetermined period of time, MR echoes can be observed through RF coil 4. The next MR excitation in the same slice cannot be performed until the MR is relaxed to a satisfactory degree. It is noted, however, that second slice S2 which is orthogonal to the body axis and displaced from the first slice S1 can be immediately excited to generate the MR phenomenon without such waiting, if the same gradient magnetic field developed by first gradient field coil 2 and an RF excitation pulse whose carrier frequency shifted by $\omega 0$ from that of the first slice are applied following the MR excitation of first slice S1 and the collection of the MR echoes. Reference is made to FIG. 3. Similarly, third slice S3 can be MR excited by applying the same gradient field by first field coil 2 and the RF excitation pulse whose carrier frequency is further $\omega 0$ shifted from that of the second slice, after the MR excitation of second slice S2 and the MR echoes collection. Third slice S3 is further displaced from second slice S2 along the body axis. Fourth slice S4, which is additionally displaced from the third slice, is MR excited by applying the same gradient field and the RF excitation pulse of the carrier frequency further $\omega 0$ shifted from that of the third slice. In this way, the MR data of second to fourth slice S2-S4 can be obtained by successively shifting the carrier frequency of the excitation pulse while the MR in the first slice S1 is sufficiently relaxed. Thus, the MR data of a plurality of slices can be obtained in a short time by repeating the process of the MR excitation and the MR data collection. This process as the combination of the MR excitation and the MR data collection is called a "multi-slicing". The process to obtain the MR image by tte multi-slicing is called a "multi-slice imaging".

Multi-slice control section 13 controls sequence controller 11, and in turn sequence controller 11 controls the operations of gradient field coils 2 and 3, and transmitter 5 at predetermined timings so as tc execute the multi-slicing process. In connection with this control, the control section 13 appropriately controls data acquisition section 8. It is possible, of course, to execute the multi-slice imaging by using multi-slice control section 13. It is noted that in this invention, multi-slice control section 13 is used in the prescan mode for the system adjustment, which is performed under control of prescan control section 14.

Description to follow is how the prescan mode is executed by prescan control section 14.

Prescan control section 14 is manually started up in a condition that object P is placed in the image pick-up area, and before the MR excitation and the MR data collection for the intended imaging. Alternatively, prescan control section 14 may be automatically started up at the outset of the imaging sequence. Prescan control section 14, as already described, operates multi-slice control section 13, and controls transmitter 5, receiver 6 and static field power source 12 on the basis of the MR receive data obtained by data acquisition section 8, and enters the operation mode for adjusting adjustment-required parameters, the static field intensity, tuning system, transmission power, and receive gain.

Figure 4:
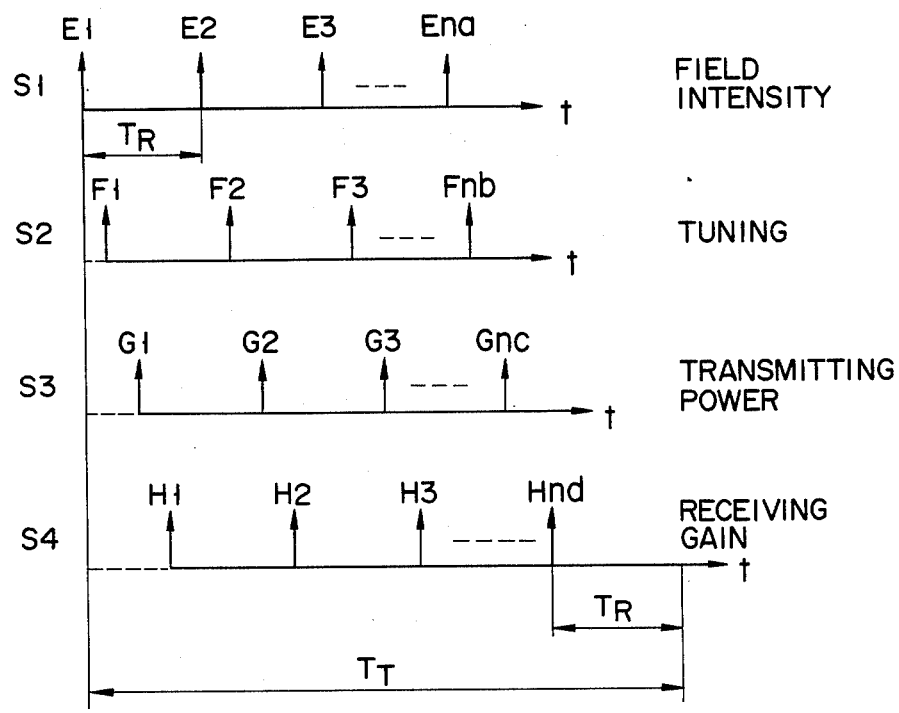
FIG. 4 shows a model of a sequence of prescan adjustment in the FIG. 2 MRI system.

FIG. 4 shows a timing chart for explaining the operation of a model of the prescan based on the multi-slicing. The first to fourth slices S1 to S4 obtained by the multi-slicing process are subjected to the adjustment of the parameters as mentioned above. Many adjustment techniques of the parameters have been known. The adjustments employed in this instance will be described below. The static magnetic field adjustment is executed in a manner that the MR data of different static magnetic fields are collected by appropriately controlling power source 12, the collected data is subjected to the Fourier analysis, and the static magnetic field to minimize the beat component is selected on the basis of the results of Fourier analysis. The tuning for receiving system is performed in a manner that a capacitance or the capacitor in the receiving system is gradually varied or swept by controlling receiver 6, and the capacitance is selected to maximize the received MR signal, namely, to tune the receiving system to the MR signal. In the transmitting power adjustment, the transmitting power is gradually varied by controlling transmitter 5 till the received MR signal is maximized. In the receiving gain adjustment, receiver 6 is controlled to have different gains in the receiving system, and plural items of received MR data are collected at these different gains. The collected data is appropriately processed to have a gain, which is suitable for the dynamic range of the signal processing system. The gain of the receiving system is set to the computed value. The MR gain is collected again and an operator confirms that the receive gain is adjusted to a proper value. If it is improper, the operator, of course, repeats the sequence of the above adjusting steps till the proper value is obtained.

While each of these adjustments is performed, other parameters are returned to the original values before the adjustment. The parameter in adjustment is set to the values as selected through the previous MR excitation and MR data collection. At the end of the prescan, these parameters are set to the appropriated values. As seen from FIG. 4, excitation timings E1 to Ena, F1 to Fnb, G1 to Gnc, and H1 to Hnd respectively for the adjustments of static field intensity, tuning system, transmitting power, and receive gain, are arranged substantially in parallel with respect to time axis.

The time sequence of the prescan adjustment will be described. To start, first slice S1 is used for the static magnetic field intensity adjustment. The first time MR excitation E1 and MR data collection are applied for this slice. The collected MR data is stored in the memory of prescan control section 14. The MR data is used for setting the the same parameter of the same slice in the second and subsequent MR excitation and MR data collection. Second slice S2 is used for the tuning. The first time MR excitation F1 and MR data collection are applied for this slice. The collected MR data is stored in the memory of prescan control section 14. The MR data is used for setting the the same parameter of the same slice in the second and subsequent MR excitation and MR data collection. Third slice S3 is used for the transmitting power adjustment. The first time MR excitation G1 and MR data collection are applied for this slice. The collected MR data is stored in the memory of prescan control section 14. The MR data is used for setting the same parameter of the same slice in the second and subsequent MR excitation and MR data collection. Fourth slice S4 is used for the receiving gain adjustment. The first time MR excitation H1 and MR data collection are applied for this slice. The collected MR data is stored in the memory of prescan control section 14. The MR data is used for setting the the same parameter of the same slice in the second and subsequent MR excitation and MR data collection. The MR excitation and MR data collection for the second to fourth slices S2 to S4 are performed during the period TR from the first excitation E1 to the next excitation E2.

Following the first excitation H1 and data collection for the fourth slice S4 are completed, or the period TR starting at the first MR excitation for the first slice S1 terminates, the second MR excitation E2 and MR data collection for the same slice S1 start for the static field strength or intensity adjustment. At this time, the variable parameter of the adjustment-required parameter is set on the basis of the previously collected MR data, which has been stored in prescan control section 14. In this way, the collected MR data is stored in prescan control section 14 and used for the subsequent parameter setting. Following this step, the second MR excitation and MT data collection are applied to the second slice S2 for the tuning. The second MR excitation and MT data collection are applied to the third slice S3 for the transmitting power adjustment. The second MR excitation and MT data collection are applied to the fourth slice S4 for the receiving gain adjustment. In this way, all of the MR excitation and MR data collection necessary for adjusting the parameters will be performed. In this case, the slices requiring a less number of the MR excitation and MR data collection for each parameter will not be subjected to the same operation if the sequences is repeated that number of times. For ease of control, the MR excitation can be continued after the necessary number of sequences are performed.

In this way, the prescan is performed and the set values of all of the adjustment-required parameters are obtained. Then, the parameters of the MRI system are set to the set values thus obtained. At this point, the prescan is completed.

The time TT of the prescan is given by the expression $(n+1) \times TR$, and can be considered as $n \times TR$. Therefore, if $n=16$, and $TR=1$ sec., TT is approximately 16 sec.

The slices requiring the less number of sequences can be set in the last stage of the excitation sequence. If so set, the prescan time TT can further be reduced. The same thing is true for other parameters, and a different number of parameters.

What is claimed is:

1. In a magnetic resonance imaging system including means for developing a static magnetic field, means for developing a gradient magnetic field to be applied to said static magnetic field, means for applying to an object to be examined a high frequency excitation pulse to excite a magnetic resonance, means for detecting the magnetic resonance generated in the object, means for controlling said static magnetic field developing means, gradient magnetic field developing means, excitation pulse generating means and detecting means so that the gradient magnetic field and excitation pulse are applied in the object placed in the static magnetic field at predetermined timings, and a magnetic resonance signal generated in the object is detected; and image processing means for obtaining magnetic resonance image data on the basis of the magnetic resonance signal as detected by said detecting means;

the improvement wherein said control means includes multi-slice control means for sequentially exciting a plurality of slices by a plurality of excitation pulses of different carrier frequencies in a common static magnetic field and a gradient magnetic field, to obtain magnetic resonance data of the plurality of slices during one excitation repetition period, and for effecting a multi-slice imaging by a predetermined number of repetitive excitations, and adjustment/control means for operating said multi-slice control means in order to adjust the adjustment-required parameters of the magnetic resonance imaging system, and for causing said adjustment/control means to execute the adjustment of the adjustment-required parameters different with said slices subject to the imaging, in connection with the multi-slice imaging.

2. The magnetic resonance imaging system according to claim 1, in which said adjustment/control means assigns adjustment-required parameters requiring a relatively large number of excitations for adjustment to the slices excited in the early stage of excitation sequence.

3. The magnetic resonance imaging system according to claim 1, in which said adjustment/control means includes a magnetic resonance restricting means, after completion of the collection of the magnetic resonance data of the slices assigned with the adjustment-required parameters requiring a relatively small number of excitations for adjustment, said magnetic resonance restricting means controlling said multi-slice control means to restrictively control the subsequent collection of magnetic resonance data of said slices.

4. The magnetic resonance imaging system according to claim 1, in which said adjustment/control means is a means for independently controlling the adjustment-required parameters for each slice in a corresponding manner.

5. The magnetic resonance imaging system according to claim 1, in which the adjustment of said adjustment-required parameter includes the adjustment to optimize the static magnetic field.

6. The magnetic resonance imaging system according to claim 1, in which the adjustment of said adjustment-required parameter includes the adjustment to tune said detecting means to the magnetic resonance in the object.

7. The magnetic resonance imaging system according to claim 1, in which the adjustment of said adjustment-required parameter includes the adjustment to optimize the power of said exciting pulse transmitting means according to the object inspected.

8. The magnetic resonance imaging system according to claim 1, in which the adjustment of said adjustment-required parameter includes the adjustment to optimize the sensitivity of said detecting means.

* * * * *